United States Patent
Nave

(10) Patent No.: US 7,206,030 B2
(45) Date of Patent: Apr. 17, 2007

(54) FAST-CONVERGENCE TWO-STAGE AUTOMATIC GAIN CONTROL (AGC)

(75) Inventor: James Edward Nave, Denton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 464 days.

(21) Appl. No.: 10/760,602

(22) Filed: Jan. 20, 2004

(65) Prior Publication Data

US 2004/0150755 A1 Aug. 5, 2004

Related U.S. Application Data

(60) Provisional application No. 60/444,349, filed on Jan. 30, 2003.

(51) Int. Cl.
*H04N 5/08* (2006.01)
*H04N 5/52* (2006.01)

(52) U.S. Cl. ............... 348/678; 348/528; 348/679; 348/682; 348/685

(58) Field of Classification Search .......... 348/255, 348/528, 678, 679, 680, 682, 685
See application file for complete search history.

(56) References Cited

U.S. PATENT DOCUMENTS

| | | | | |
|---|---|---|---|---|
| 4,213,097 A | * | 7/1980 | Chiu et al. ............... 330/51 |
| 5,767,914 A | * | 6/1998 | Jennes et al. ............. 348/501 |
| 6,049,355 A | * | 4/2000 | Kameyama ............... 348/241 |
| 6,169,584 B1 | * | 1/2001 | Glaab et al. ............. 348/724 |
| 6,363,127 B1 | * | 3/2002 | Heinonen et al. ......... 375/345 |
| 6,750,906 B1 | * | 6/2004 | Itani et al. ............... 348/229.1 |
| 2004/0183953 A1 | * | 9/2004 | Nave ....................... 348/678 |
| 2005/0024509 A1 | * | 2/2005 | Itani et al. ............... 348/255 |
| 2006/0089813 A1 | * | 4/2006 | Mushirahad et al. ...... 702/39 |

FOREIGN PATENT DOCUMENTS

GB     2229333     * 9/1990

* cited by examiner

*Primary Examiner*—Brian P. Yenke
(74) *Attorney, Agent, or Firm*—W. James Brady, III; Frederick J. Telecky, Jr.

(57) ABSTRACT

Disclosed are methods and systems for automatic gain control (AGC) in circuits. The disclosed methods and systems provide accurate and rapidly converging automatic gain control suited for video applications. According to disclosed preferred embodiments of the invention, a signal amplitude controlling method is responsive to gain underflow or overflow. A new fine gain control value is extrapolated and a new coarse gain control value is determined. The new fine gain and new coarse gain control values are applied to the signal to produce an output signal within a preselected output amplitude range.

17 Claims, 3 Drawing Sheets

FAST-CONVERGENCE TWO-STAGE AUTOMATIC GAIN CONTROL (AGC)

RELATED APPLICATIONS

This application claims priority based on Provisional Patent Application 60/444,349, filed Jan. 30, 2003. This application and the aforementioned provisional application have a common inventor and are assigned to the same entity. This application is also related to patent application, Ser. No. 10/769,100, filed Jan. 30, 2004, and patent application, Ser. No. 10/748,966, filed Dec. 30, 2003, which are incorporated herein by this reference in their entirety for all purposes.

TECHNICAL FIELD

The invention relates to signal processing methods and systems. More particularly, the invention relates to methods and systems for automatic gain control in processing video signals.

BACKGROUND OF THE INVENTION

The reproduction of electronic video images involves the transmission of a waveform known as a video signal. Various types of video signals, such as for example composite video, S-video, and component video, have certain shared characteristics. In general, the video signal includes both video image display information and associated synchronizing information. A graphical representation of a generic video signal 99 known in the arts is shown in FIG. 1. As shown in the example, the video information is generally in the form of a signal having a black reference level 100, and a higher level representing white 200. The continuum of levels 300 between the black level 100 and the white level 200 is then used to represent degrees of gray. The synchronizing information 400 used in formatting the signal display includes vertical and horizontal display alignment and color decoding information. The lowest value of the synchronizing signal is referred to as the "sync tip" 500. The synchronizing pulses 400 are positioned in portions of the signal 99 that do not contain video display information, that is, below the black level 100 to prevent disruption of the video image display. This is referred to as the "blank level" 600. The synchronizing pulses 400 shown in this example have a reference level at the blank level 600.

The video signal waveform 99 from the sync tip level 500 to the white level 200 used in this example has a nominal peak-to-peak amplitude of 1V. The "front porch" 900 refers to the portion of the video signal 99 that occurs between the end of the active video interval 800 and the falling/leading edge of the horizontal sync pulse 500. The "back porch" 700 refers to the portion of the video signal 99 that occurs between the rising/trailing edge of the horizontal sync pulse 500 and the beginning of the active video interval 800.

Automatic gain control (AGC) circuits are useful for many applications including the display of video images. Stored information concerning the video signal may have been recorded at different recording levels, or variations in the amplitude of the incoming video signal may occur for other reasons. AGC circuits are used to provide an output of constant amplitude from an input varying in amplitude. Constant output is achieved by providing a gain in inverse proportion to the input amplitude.

Although video signals in the most commonly used formats, NTSC, PAL and SECAM, for example, are analog, they are often encoded and decoded digitally. The amplitude of the video signal is often controlled utilizing a two-stage automatic gain control (AGC) scheme where a coarse gain adjustment is performed in the analog domain prior to analog-to-digital conversion and a fine gain adjustment is performed in the digital domain after analog-to-digital conversion. The overall system gain (excluding the gain of the analog-to-digital converter) is equal to the product of the coarse analog gain and the fine digital gain. Problems are encountered in the arts whenever the two-stage AGC must change the coarse gain to maintain the proper video signal amplitude. If the upper limit of the fine gain control range is reached (overflow condition), the coarse gain must be increased; if lower limit of the fine gain control range is reached (underflow condition), the coarse gain must be decreased. Ideally, the coarse gain stage would have exponential gain steps (e.g. 2 dB/step) equal to the full-scale control range of the fine gain stage (e.g. 2559/2048). However, the coarse gain stage often has linear gain steps since it is less expensive to implement in silicon. This causes the product of the coarse gain and the fine gain to be non-monotonic which leads to undesirable video amplitude fluctuations whenever the fine digital gain overflows or underflows into the coarse analog gain. If the AGC updates the gain at a line rate, these amplitude fluctuations might not be noticeable (i.e. detectable by the human eye); however, if the AGC updates the gain at a slower rate, such as the frame rate, amplitude fluctuations typically cause easily visible flashing, also known as frame flicker. Various technical advantages may be obtained by updating the gain at a frame rate, however. It would be useful and desirable in the arts to provide automatic gain control methods and systems with the capability of reaching an optimum gain setting at a frame rate without detriment to the video image. It would also be advantageous for such AGC methods and systems to converge quickly to an approximately optimal gain value.

SUMMARY OF THE INVENTION

In carrying out the principles of the present invention, in accordance with preferred embodiments thereof, methods and systems are provided for automatic gain control responsive to fine gain underflow and overflow conditions due to variations in the amplitude of the input signal.

According to one aspect of the invention, a signal amplitude controlling method includes steps for determining the optimum coarse analog gain and fine digital gain based on whether an initial unfiltered calculation (i.e. filter coefficient $\beta=1$) of the fine digital gain control value $G_F$ causes an underflow or overflow condition. The resulting coarse gain control value $G_C[n]$ and fine gain control value $G_F[n]$ are applied to the video system in order to maintain the amplitude of the output video signal within a pre-selected range.

According to another aspect of the invention, a preferred embodiment includes a step of determining a coarse gain control value $G_C[n]$ according to the relationship, $$G_C[n]=(a'/b'+G_C[n-1])*(a/b+G_F)*0.5*[(a/b+G_{MIN})^{-1}+(a/b+G_{MAX}+1)^{-1}]-a'/b'+0.5, \quad \text{(Equation 3)}$$

where $G_C[n-1]$ is the preceding coarse gain control value, $G_F$ is the unfiltered fine gain control value from the detected underflow or overflow condition, $G_{MIN}$ is a pre-selected minimum fine gain control value, $G_{MAX}$ is a pre-selected maximum fine gain control value, and wherein a' is the y-intercept and b' is the slope of the linear coarse gain control equation, and a is the y-intercept and b is the slope of the linear fine gain control equation.

According to still another aspect of the invention, a preferred embodiment includes the step of modeling a new fine gain control value $G_F[n]$, using the relationship, $$G_F[n]=-a/b+(a/b+G_F)*[(a'/b'+G_C[n-1])/(a'/b'+G_C[n])] \quad \text{(Equation 6),}$$

using a first coarse gain control value $G_C[n-1]$, and a second coarse gain control value $G_C[n]$, where $G_F$ is the unfiltered fine gain control value from the detected underflow or overflow condition, where a' is the y-intercept and b' is the slope of the linear coarse gain control equation, and a is the y-intercept and b is the slope of the linear fine gain control equation. Steps also include selecting a new coarse gain control value $G_C[n]$, such that the new fine gain control value $G_F[n]$ is maintained between $G_{MIN}$ and $G_{MAX}$, where $G_{MIN}$ is a pre-selected minimum fine gain control value, and $G_{MAX}$ is a pre-selected maximum fine gain control value.

According to aspects of the invention, preferred embodiments are described for use in performing automatic gain control in a video signal processing system.

According to aspects of the invention, preferred embodiments are described for use in performing automatic gain control in video signal processing systems where the steps are performed at intervals greater than line-intervals, for example, once per frame during a vertical blanking interval (VBI) of the video signal.

Preferred embodiments of the invention are also described encompassing systems in which input monitoring means monitor a video input signal amplitude for comparison with a pre-selected nominal value, and gain adjusting means responsively adjusts gain values in order to maintain the video signal amplitude within a given range.

The invention provides technical advantages including but not limited to providing rapid and accurate automatic gain control useful for video signal processing systems. Additional advantages include the capability of implementation at a frame rate. These and other features, advantages, and benefits of the present invention will become apparent to those of ordinary skill in the art upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the figures unless otherwise noted. Like numerals refer to like parts throughout the various figures. Descriptive and directional terms used in the written description such as upper, lower, left, right, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

In general, the invention provides methods and systems for automatic gain control in electronic circuits. The examples and preferred embodiments described herein refer to video signal applications, however, it should be understood by those familiar with the arts that numerous other applications would be well served by use of the principles of the invention.

In a video system utilizing a two-stage automatic gain control (AGC) scheme, the overall system gain G (excluding the gain of the analog-to-digital converter) may be expressed as the product of the coarse analog gain and the fine digital gain. In the preferred embodiment of this invention, the coarse analog gain and the fine digital gain are both linearly controllable using the coarse gain control value $G_C[n]$ and the fine gain control value $G_F[n]$ respectively. Thus, the overall system gain G as a function of coarse gain control value $G_C[n]$ and fine gain control value $G_F[n]$ may be written as follows, $$G=(a'+b'*G_C[n])*(a+b*G_F[n]) \quad \text{(Equation 1),}$$

where a' is the y-intercept and b' is the slope of the linear coarse gain control equation, and a is the y-intercept and b is the slope of the linear fine gain control equation. If the y-intercept a is set equal to zero, then Equation 1 simplifies to:

$$G=(a'+b'*G_C[n])*(b*G_F[n]) \quad \text{(Equation 2).}$$

Figure 1:
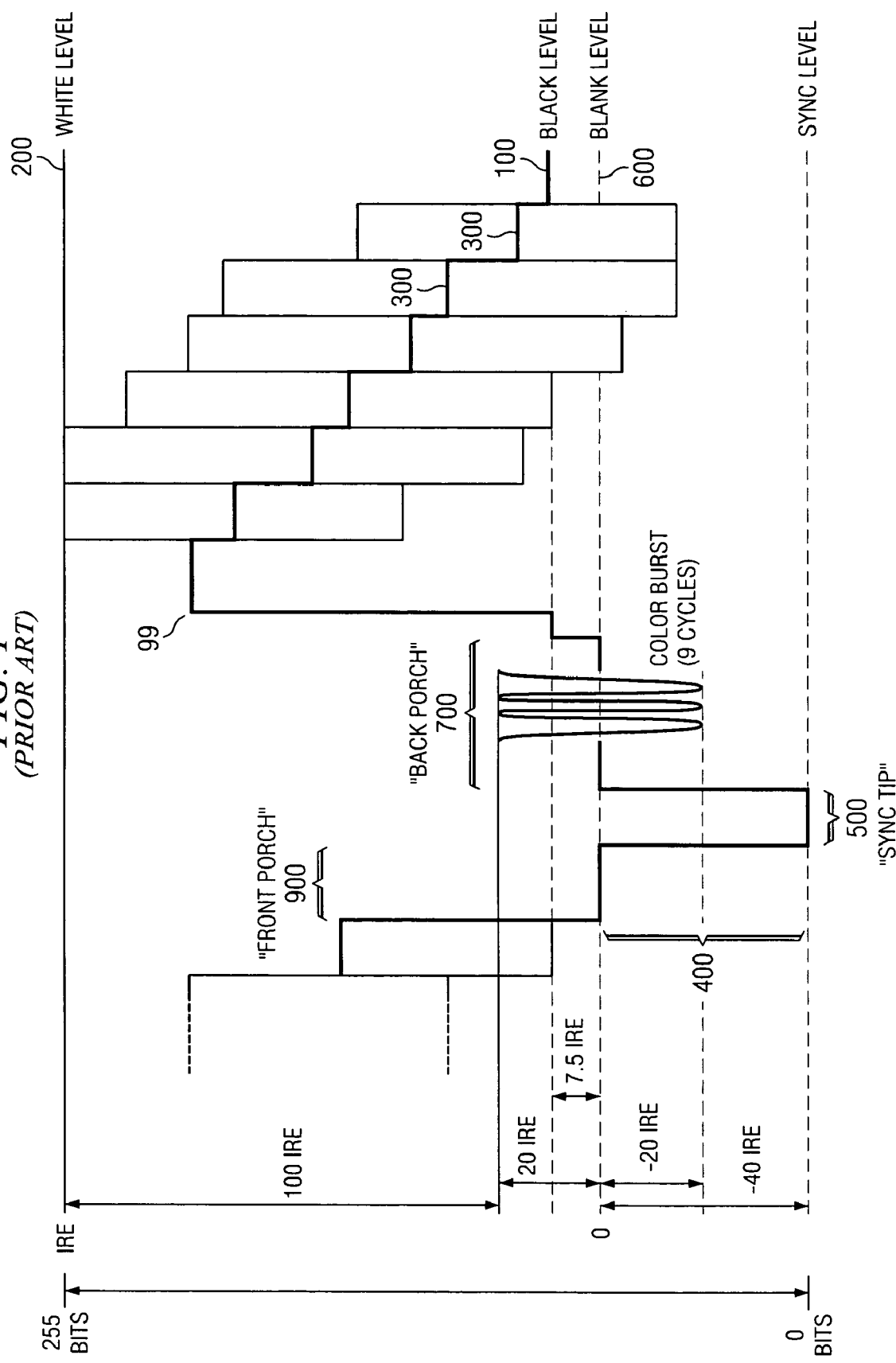
FIG. 1 is an example of a graphical depiction of a representative video signal known in the arts.
Figure 2:
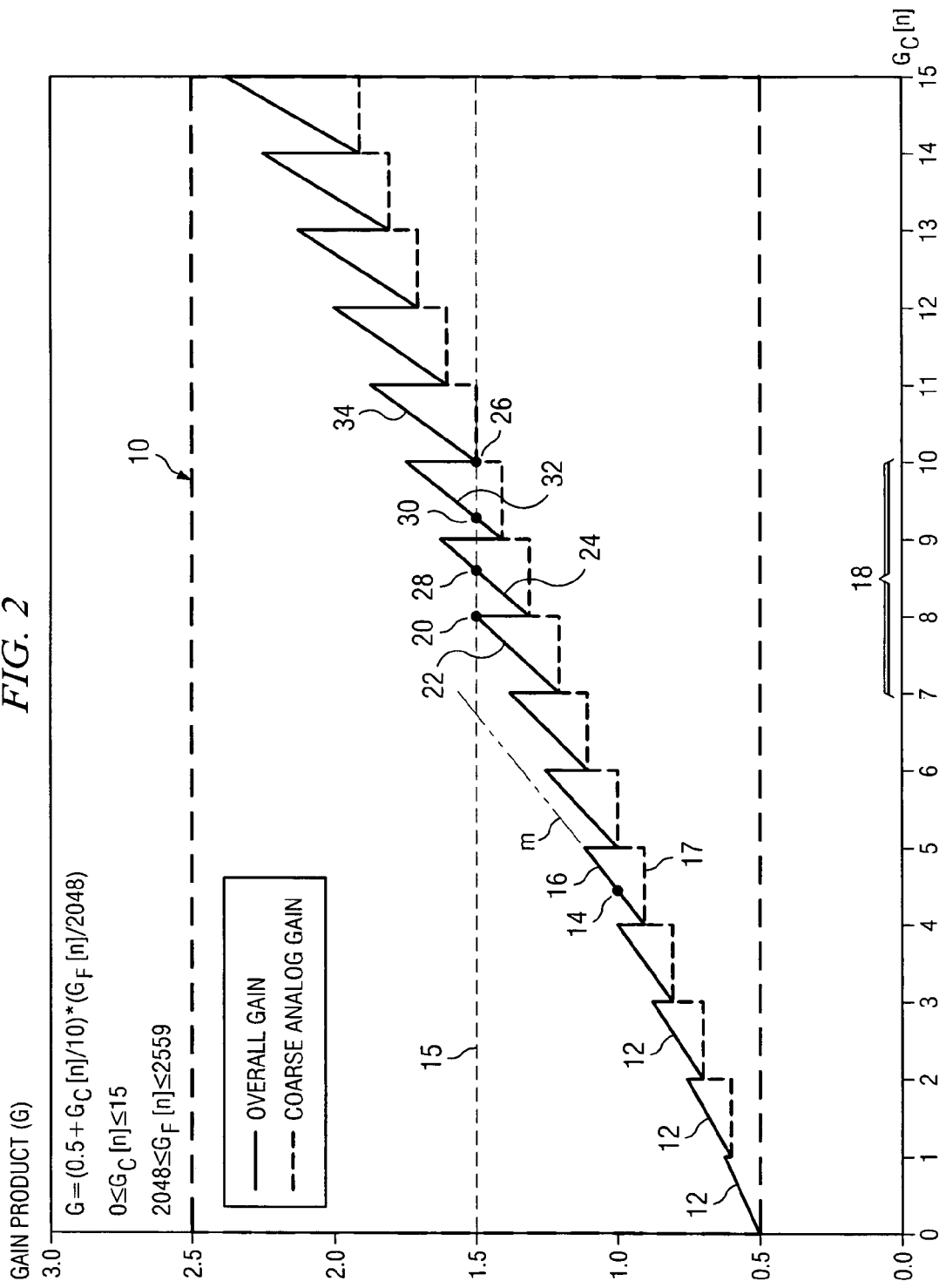
FIG. 2 is a graphical representation of an example of automatic gain control according to a preferred embodiment of the invention.

It should be understood that the y-intercept has been set to zero for the sake of convenience in this example. Any y-intercepts may be used without departure from the invention so long as a constant value is selected. FIG. 2 provides a graphical example of the overall gain G of Equations 1 and 2 and its relationship to the coarse gain control value $G_C[n]$. A range 10 of overall gain values G from 0.5 to 2.5 is selected for the sake of providing an example for illustrating the invention. It can be seen that the overall gain G includes numerous segments 12, the slope m of each segment is dependent on the coarse gain control value $G_C[n]$ as follows.

$$m=(a'+b'*G_C[n])*(b) \quad \text{(Equation 3).}$$

Referring primarily to FIG. 2, a qualitative example describing the general principles of the invention is provided. Examining the selected range 10 of gain values, this example begins with the arbitrary assumption that the overall gain G is initially set at 1.0 as indicated by the point indicated by reference numeral 14. It is further arbitrarily assumed for purposes of illustration that the amplitude of the video input signal (not shown) necessitates a change in the overall gain G to 1.5, indicated by reference numeral 15. It can be seen that if the gain segment 16 corresponding to a coarse analog gain 17 were simply to be extended at slope m to an overall gain G of 1.5, a fine gain overflow condition would result. The overflow would occur in the attempt to extend the overall gain value G of segment 16 beyond the range supported by the fine analog gain stage for a coarse analog gain 17. Thus, assuming that it is desired to reach the new overall gain G, changing the coarse gain control value $G_C[n]$ is required.

By observing the locations where the overall gain G intersects the line representing the desired overall gain 15 (reference numerals 20, 28, 30, 36), it should be apparent that the desired overall gain G of 1.5 can be achieved using any one of four possible coarse gain control values $G_C[n]$ 18.

It should be observed that each corresponding segment 22, 24, 32, 34 of the overall gain G has an increasingly steeper slope m. This may be understood in light of Equations 1 and 2 indicating that the slope m increases as the coarse gain control value $G_C[n]$ is increased. Using the invention, however, the preferred coarse gain control value $G_C[n]$ is chosen using steps to avoid or reduce the possibility of further occurrence of underflow or overflow of the fine gain control value $G_F[n]$. For a coarse gain control value $G_C[n]$ of 7 (segment 22), it can be seen that the fine gain control value $G_F[n]$ needs to be at its extreme upper limit ($G_F[n]$=2559) to achieve the desired overall gain 15. Thus, any further increase in the overall gain G would require an upward adjustment of the coarse gain control value $G_C[n]$. Conversely, it can be seen that the fine gain control value $G_F[n]$ needs to be at its extreme lower limit ($G_F[n]$=2048) for a coarse gain control value $G_C[n]$ of 10 (segment 34). Thus, any further decrease in the overall gain G would require a decrease in the coarse gain control value $G_C[n]$. The two remaining coarse gain control values $G_C[n]$ of 8 and 9 (segments 28 and 30) provide a fine gain control value $G_F[n]$ that lies further away from its upper and lower range limits, however. In general, as further described, the methods of the invention are adapted to select the coarse gain control value $G_C[n]$ which provides a fine gain control value $G_F[n]$ that is furthest from its upper or lower range limits. Since a smaller coarse analog gain provides a larger analog dynamic range, the coarse gain control value $G_C[n]$ of 8 (segment 24) is preferred in this case.

Figure 3:
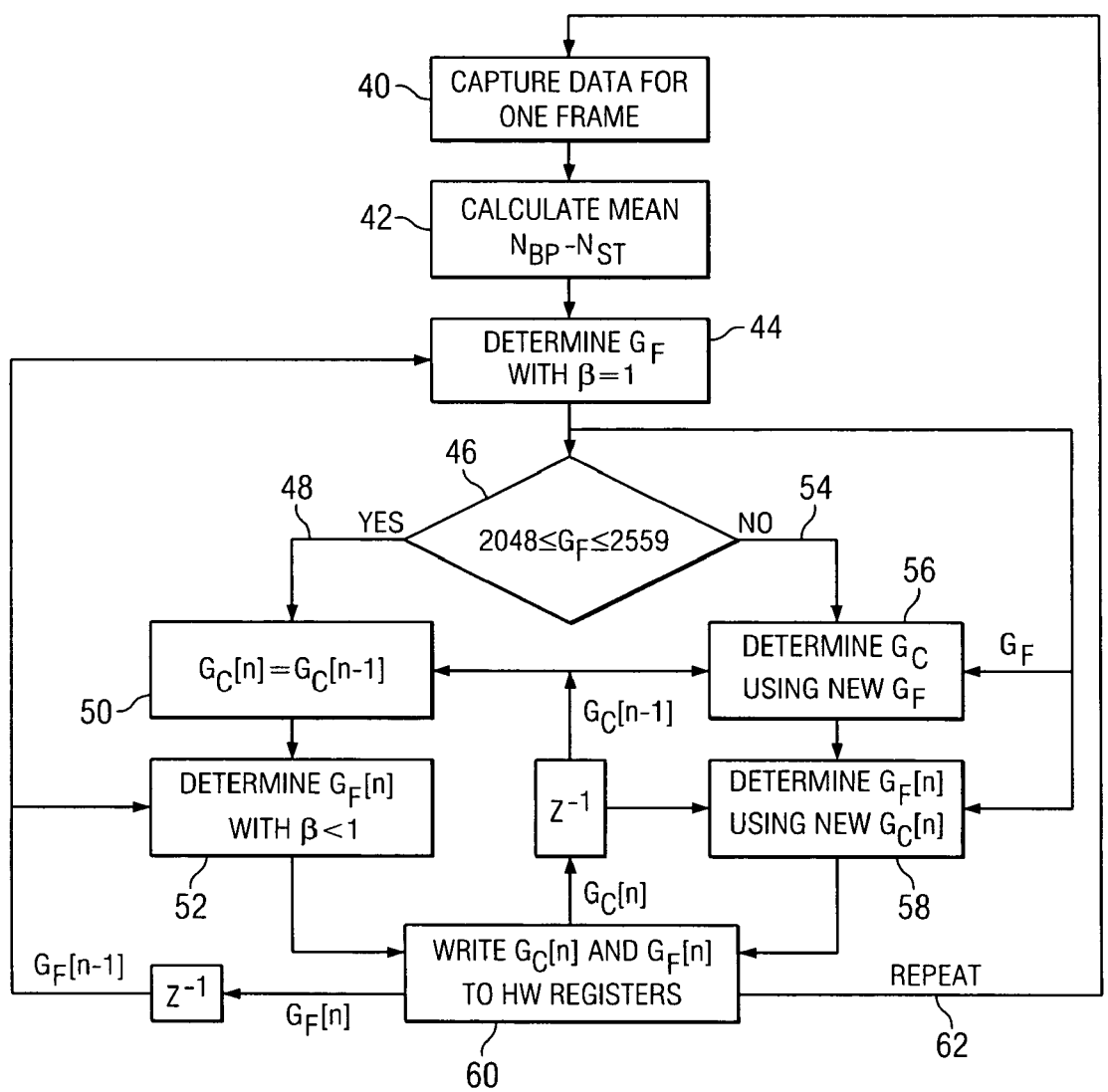
FIG. 3 is a process flow diagram illustrating an example of a preferred embodiment of the invention.

A process flow diagram illustrating an overview of steps in a preferred embodiment of the invention is shown in FIG. 3. First, the measured back-porch level and sync-tip level for each horizontal line is captured for an entire video frame as indicated in step 40. Next, the mean back-porch level $N_{BP}$ and sync-tip level $N_{ST}$ for that frame is calculated 42. The difference between the back-porch level $N_{BP}$ and the sync-tip level $N_{ST}$ represents the actual or measured sync height. The ratio of the desired sync height ($N_{NOM}$) to the measured sync height ($N_{BP}-N_{ST}$) is used in Equation 4 below to determine the desired fine gain control value $G_F[n]$.

$$G_F[n]=G_F[n-1]+\beta*(a/b+G_F[n-1])*[NNOM/(N_{BP}-N_{ST})-1] \quad \text{(Equation 4)}$$

Equation 4 is a first-order recursive filter having a filter coefficient of $\beta$. The filter coefficient value $\beta$ is preferably a power-of-2 fraction (e.g. 1, ½, ¼ or ⅛) so that the multiplication can be performed without introducing any additional quantization error by using a simple shift operation. The unfiltered fine gain control value $G_F$ is first calculated using a filter coefficient value $\beta$ of unity (step 44). The filter coefficient value $\beta$ must be set to unity for step 44 so that the unfiltered fine gain control value $G_F$ required to achieve the desired sync height ($N_{NOM}$) while using the current coarse gain control value $G_C[n-1]$ can be determined in one iteration (e.g., one frame). Although the preferred embodiment describes the use of the invention at the frame rate of the video signal, longer or shorter update intervals may also be used.

The unfiltered fine gain control value $G_F$ determined by Equation 4 is then monitored for underflow and overflow as represented by decision diamond 46. If neither an underflow nor overflow condition occurs (i.e. $G_{MIN} \leq G_F \leq G_{MAX}$) as indicated by arrow path 48, the coarse gain control value $G_C[n]$ remains unchanged as shown by box 50; the previous course gain control value $G_C[n-1]$ is retained. Next, a new fine gain control value $G_F[n]$ is then determined using Equation 4 again (step 52), but this time using a filter coefficient value of $\beta<1$, preferably a power of two fraction. However, if an underflow or overflow condition does occurs (i.e. $G_F>G_{MAX}$=2559, or $G_F<G_{MIN}$=2048) as indicated by arrow path 54, then a new coarse gain control value $G_C[n]$ is determined using equation 5 below (step 56).

$$G_C[n]=(a'/b'+G_C[n-1])*(a/b+G_F)*0.5$$
$$*[(a/b+G_{MIN})^{-1}+(a/b+G_{MAX}+1)^{-1}]-a'/b'+0.5 \quad \text{(Equation 5)}$$

where a' is the y-intercept and b' is the slope of the linear coarse gain control equation, and a is the y-intercept and b is the slope of the linear fine gain control equation.

Extending the numerical example for the case when the y-intercept a equals zero yields;

$$G_C[n]=(a'/b'+G_C[n-1])*(G_F)*9/5/4096-a'/b'+0.5 \quad \text{(Equation 6)},$$

Where: $G_F$ represents the unfiltered 12-bit fine gain control value determined in step 44 and $G_C[n-1]$ represents the current 4-bit coarse gain control value that indirectly caused the unfiltered fine digital gain overflow or underflow condition. These gain resolutions are used by way of example only, the invention may be used with video decoders of various resolutions. Next, a new fine gain control value $G_F[n]$ is determined using equation 7 below (step 58), $$G_F[n]=a/b+(a/b+G_F)*[(a'/b'+G_C[n-1])/(a'/b'+G_C[n])] \quad \text{(Equation 7)}.$$

where a' is the y-intercept and b' is the slope of the linear coarse gain control equation, and a is the y-intercept and b is the slope of the linear fine gain control equation. Lastly, the new gain control values $G_F[n]$, $G_C[n]$, obtained as described, are subsequently entered into the appropriate hardware registers as represented by step 60 and the steps are reiterated as indicated by arrow path 62.

Thus, the invention provides improved automatic gain control methods and systems. The invention may be readily applied to video signal processing systems, providing advantages in terms of accuracy, speed, and extended utility. Examples of video systems where the invention may be used include, but are not limited to; NTSC, M-NTSC, NTSC-J, NTSC 4.43, PAL, M-PAL, B, D, G, H, or N-PAL, SECAM, B, D, G, H, K, K1, or L-SECAM. While the invention has been described with reference to certain illustrative embodiments, the description of the methods and systems described are not intended to be construed in a limiting sense. For example, although using the sync-height as the primary amplitude reference is described for the preferred embodiment, other amplitude references such as the burst amplitude, composite peak, or luma peak amplitude may be used. Combinations of various amplitude references may also be used. Various modifications and combinations of the illustrative embodiments as well as other advantages and embodiments of the invention will be apparent to persons skilled in the art upon reference to the description and claims.

I claim:

1. A signal amplitude controlling method for use in a system having an overall gain expressible as the product of a coarse analog gain and a fine digital gain, the method comprising the steps of:

monitoring an input video signal for determining a desired overall gain value;

determining an unfiltered fine gain control value using a first-order filter coefficient of unity and a first coarse gain control value;

monitoring the unfiltered fine gain control value for underflow and overflow outside of a desired range;

in the event no underflow or overflow occurs, using the first coarse gain control value as a second coarse gain control value, and a filter coefficient of less than one to determine a second fine gain control value;

in the event underflow or overflow occurs, using the unfiltered fine gain control value and the first coarse gain control value to determine a second coarse gain control value;

using the second coarse gain control value, determining a second fine gain control value;

applying the second coarse gain control value and the second fine gain control value to the input video signal to produce an output video signal within a pre-selected output amplitude range.

2. A signal amplitude controlling method according to claim 1 wherein the second overall gain value comprises the product of the second coarse gain value and the second fine gain control value.

3. A signal amplitude controlling method according to claim 1 wherein the calculation interval is greater than the line rate of the input signal.

4. A signal amplitude controlling method according to claim 1 wherein the calculation interval is equal to the frame rate of the input signal.

5. A signal amplitude controlling method according to claim 1 wherein the calculation interval is greater than the frame rate of the input signal.

6. A signal amplitude controlling method according to claim 1 wherein the step of determining an unfiltered fine gain control value $G_F$ further comprises steps of:

using a first-order filter coefficient value β of unity, determining an unfiltered fine gain control value $G_F$ according to the relationship;

$$G_F = G_F[n-1] + \beta*(a/b + G_F[n-1])* [N_{NOM}/(N_{BP}-N_{ST})-1], \quad \text{(Equation 4)};$$

wherein $N_{BP}$ is the mean back-porch level and $N_{ST}$ is the mean sync-tip level for the current video frame;

wherein $N_{NOM}$ is the desired sync height;

wherein a is the y-intercept and b is the slope of the linear fine gain control equation;

for the condition $G_F < G_{MIN}$, selecting a new coarse gain control value $G_C[n]$, such that a new fine gain control value $G_F[n]$ is maintained between $G_{MIN}$ and $G_{MAX}$;

for the condition $G_{F<GMAX}$ selecting a new coarse gain control value $N_{CG}$, such that a new fine gain control value $G_F[n]$ is maintained between $G_{MIN}$ and $G_{MAX}$;

wherein $G_{MIN}$ is a pre-selected minimum fine gain control value, and $G_{MAX}$ is a pre-selected maximum fine gain control value.

7. A signal amplitude controlling method according to claim 1 wherein the step of determining a second coarse gain control value $G_C[n]$ further comprises steps of:

using an unfiltered fine gain control value $G_F$, and using a first coarse gain control value $G_C[n-1]$, determining a second coarse gain control value $G_C[n]$ according to the relationship, $$G_C[n] = (a'/b' + G_C[n-1])*(a/b+G_F)*0.5*$$
$$[(a/b+G_{MIN})^{-1} + (a/b+G_{MAX+}1)^{-1}] - a'/b' + 0.5 \quad \text{(Equation 5)};$$

wherein $G_{MIN}$ is a pre-selected minimum fine gain control value, and $G_{MAX}$ is a pre-selected maximum fine gain control value, and wherein a' is the y-intercept and b' is the slope of the linear coarse gain control equation, and a is the y-intercept and b is the slope of the linear fine gain control equation.

8. The method according to claim 1 further comprising the steps of representing the first fine gain control value $G_F[n]$ and the second fine gain control value $G_F[n]$ as a 12-bit digital value and representing the first coarse gain control value $G_C[n-1]$ and the second coarse gain control value $G_C[n]$ as 4-bit digital values.

9. A signal amplitude controlling method according to claim 1 further comprising the step of:

using a first coarse gain control value $G_C[n-1]$, and using a second coarse gain control value $G_C[n]$, modeling a fine gain control value $G_F[n]$ using the relationship, $$G_F[n] = -a/b + (a/b+G_F)*[(a'/b'+G_C[n-1])/(a'/b'+G_C[n])] \quad \text{(Equation 7)};$$

wherein a' is the y-intercept and b' is the slope of the linear coarse gain control equation, and a is the y-intercept and b is the slope of the linear fine gain control equation.

10. A method for automatic gain control in a video signal processing system wherein an overall gain may be expressed as the product of a coarse analog gain and a fine digital gain, the method comprising the steps of:

monitoring an input video signal for determining a desired overall gain value;

determining an unfiltered fine gain control value $G_F$ using a first-order filter coefficient of unity and a first coarse gain control value $G_C[n-1]$;

monitoring the unfiltered fine gain control value $G_F$ for underflow and overflow outside of a desired range;

in the event no underflow or overflow occurs, using the first coarse gain control value $G_C[n-1]$ as a second coarse gain control value $G_C[n]$, and a filter coefficient of less than one to determine a second fine gain control value $G_F[n]$;

in the event underflow or overflow occurs, using the unfiltered fine gain control value $G_F$ and the first coarse gain control value $G_C[n-1]$ to determine a second coarse gain control value $G_C[n]$, then using the second coarse gain control value $G_C[n]$, determining a second fine gain control value $G_F[n]$;

applying the second coarse gain control value $G_C[n]$ and the second fine gain control value $G_F[n]$ to the input video signal to produce an output video signal within a pre-selected output amplitude range.

11. The method according to claim 10 further comprising the step of reiterating all steps at intervals greater than once per video signal line.

12. The method according to claim 10 further comprising the step of reiterating all steps once per video signal frame.

13. The method according to claim 10 further comprising the step of reiterating all steps at intervals greater than once per video signal frame.

14. The method for automatic gain control in a video signal processing system according to claim 10 wherein the step of determining an unfiltered fine gain control value $G_F$ further comprises steps of:

using a first-order filter coefficient value β of unity, determining an unfiltered fine gain control value $G_F$ according to the relationship, $$G_F = G_F[n-1] + \beta*(a/b+G_F[n-1])* [N_{NOM}/(N_{BP}N_{ST})-1] \quad \text{(Equation 4)}$$

wherein $N_{BP}$ is the mean back-porch level and $N_{ST}$ is the mean sync-tip level for the current video frame;

wherein $N_{NOM}$ is the desired sync height;

wherein a is the y-intercept and b is the slope of the linear fine gain control equation;

for the condition $G_F < G_{MIN}$, selecting a new coarse gain control value $G_C[n]$, such that a new fine gain control value $G_F[n]$ is maintained between $G_{MIN}$ and $G_{MAX}$;

for the condition $G_F > G_{MAX}$ selecting a new coarse gain control value $N_{CG}$, such that a new fine gain control value $G_F[n]$ is maintained between $G_{MIN}$ and $G_{MAX}$;

wherein $G_{MIN}$ is a pre-selected minimum fine gain control value, and $G_{MAX}$ is a pre-selected maximum fine gain control value.

15. The method for automatic gain control in a video signal processing system according to claim 10 wherein the step of determining a second coarse gain control value $G_C[n]$ further comprises steps of:

using an unfiltered fine gain control value $G_F$, and using a first coarse gain control value $G_C[n-1]$, determining a second coarse gain control value $G_C[n]$ according to the relationship, $$G_C[n] = (a'/b' + G_C[n-1]) * (a/b + G_F) * 0.5$$
$$*[(a/b + G_{MIN})^{-1}(a/b + G_{MAX} + 1)^{-1}] - a'/b' + 0.5 \quad \text{(Equation 5)};$$

wherein $G_{MIN}$ is a pre-selected minimum fine gain control value, and $G_{MAX}$ is a pre-selected maximum fine gain control value; and wherein a' is the y-intercept and b' is the slope of the linear coarse gain control equation, and a is the y-intercept and b is the slope of the linear fine gain control equation.

16. The method according to claim 15 further comprising the steps of representing the first fine gain control value $G_F[n-1]$ and the second fine gain control value $G_F[n]$ as a 12-bit digital value and representing the first coarse gain control value $G_C[n-1]$ and the second coarse gain control value $G_C[n]$ as 4-bit digital values.

17. The method for automatic gain control in a video signal processing system according to claim 10 further comprising the step of:

using a first coarse gain control value $G_C[n-1]$, and using a second coarse gain control value $G_C[n]$, modeling a fine gain control value $G_F[n]$ using the relationship, $$G_F[n] = -a/b + (a/b + G_F) *$$
$$[(a'/b' + G_C[n-1]) / (a'/b' + G_C[n])] \quad \text{(Equation 7)};$$

wherein a' is the y-intercept and b' is the slope of the linear coarse gain control equation, and a is the y-intercept and b is the slope of the linear fine gain control equation.

* * * * *